(12) United States Patent
Widmark

(10) Patent No.: US 11,246,000 B2
(45) Date of Patent: Feb. 8, 2022

(54) AUDIO PRECOMPENSATION FILTER OPTIMIZED WITH RESPECT TO BRIGHT AND DARK ZONES

(71) Applicant: DIRAC RESEARCH AB, Uppsala (SE)

(72) Inventor: Simon Widmark, Järlåsa (SE)

(73) Assignee: DIRAC RESEARCH AB, Uppsala (SE)

( * ) Notice: Subject to any disclaimer, the term of this patent is extended or adjusted under 35 U.S.C. 154(b) by 362 days.

(21) Appl. No.: 16/467,457

(22) PCT Filed: Dec. 7, 2016

(86) PCT No.: PCT/SE2016/051228
§ 371 (c)(1),
(2) Date: Jun. 6, 2019

(87) PCT Pub. No.: WO2018/106163
PCT Pub. Date: Jun. 14, 2018

(65) Prior Publication Data
US 2021/0289304 A1    Sep. 16, 2021

(51) Int. Cl.
*H04S 7/00*     (2006.01)
(52) U.S. Cl.
CPC ............ *H04S 7/30* (2013.01); *H04S 2400/13* (2013.01)
(58) Field of Classification Search
CPC combination set(s) only.
See application file for complete search history.

(56) References Cited

U.S. PATENT DOCUMENTS 9,392,390 B2   7/2016   Olsen et al.
9,426,600 B2   8/2016   Bahne et al.
(Continued)

FOREIGN PATENT DOCUMENTS

CN    103916810 A    7/2014
CN    104186001 A    12/2014
(Continued)

OTHER PUBLICATIONS

Search Report issued in Chinese Patent Application No. 201680091489.5 dated Jul. 8, 2020 with English translation provided.
(Continued)

*Primary Examiner* — Duc Nguyen
*Assistant Examiner* — Assad Mohammed
(74) *Attorney, Agent, or Firm* — Nixon & Vanderhye

(57) ABSTRACT

Disclosed is a system configured to determine filter parameters of an audio precompensation filter for the compensation of an associated sound generating system having at least two loudspeakers. The system is configured to obtain sound field models describing the sound field in at least one region of space designated the bright zone and the sound field in at least one region of space designated the dark zone. The system is also configured to obtain a target sound field in the bright zone. Further, the system is configured to determine filter parameters of the audio precompensation filter so that a criterion function is optimized under the constraint of causality and stability of the dynamics of the audio precompensation filter to enable reproduction of a desired target sound field in the bright zone, while reproducing as little sound as possible in the dark zone.

8 Claims, 12 Drawing Sheets

(56) References Cited

U.S. PATENT DOCUMENTS

| | | | |
|---|---|---|---|
| 9,781,510 B2 | 10/2017 | Brannmark et al. | |
| 10,251,015 B2 | 4/2019 | Bahne et al. | |
| 2013/0259254 A1 | 10/2013 | Xiang et al. | |
| 2014/0056431 A1* | 2/2014 | Kano | H04S 7/30 381/17 |
| 2014/0064501 A1* | 3/2014 | Olsen | H04S 7/40 381/58 |
| 2015/0264510 A1* | 9/2015 | Jin | H04S 7/307 381/303 |
| 2015/0350805 A1 | 12/2015 | Christoph | |
| 2017/0171396 A1* | 6/2017 | Sun | H04B 3/235 |

FOREIGN PATENT DOCUMENTS

| | | | |
|---|---|---|---|
| CN | 104769968 A | 7/2015 | |
| EP | 2257083 A1 | 12/2010 | |
| EP | 2755405 A1 | 7/2014 | |
| EP | 2930957 A1 | 10/2015 | |
| JP | 2015-512579 A | 4/2015 | |
| JP | 2015-231087 A | 12/2015 | |
| JP | 2016-126335 A | 7/2016 | |
| WO | 2013/135819 A1 | 9/2013 | |
| WO | 2013/141768 A1 | 9/2013 | |
| WO | 2014/007724 A1 | 1/2014 | |
| WO | 2016/028199 A1 | 2/2016 | |
| WO | 2016/162058 A1 | 10/2016 | |
| WO | 2016/165776 A1 | 10/2016 | |
| WO | WO-2016162058 A1 * | 10/2016 | H04S 7/302 |

OTHER PUBLICATIONS

Brännmark, "Robust Audio Precompensation with Probabilistic Modeling of Transfer Function Variability", 2009 IEEE Workshop on Applications of Audio and Acoustics, Oct. 18-21, 2009, New Paltz, NY.

Brännmark et al., "Compensation of Loudspeaker-Room Responses in a Robust MIMO Control Framework", IEEE Transactions on Audio, Speech, and Language Processing, 2013, pp. 1201-1216, vol. 21, No. 6.

Park et al., "Generation of Independent Bright Zones for a Two-Channel Private Audio System", Journal of the Audio Engineering Society, 2010, pp. 382-393, vol. 58, No. 5.

International Search Report and Written Opinion, dated Sep. 21, 2017, from corresponding PCT application No. PCT/SE2016/051228.

Elliot et al., "Regularisation and Robustness of Personal Audio Systems," ISVR Technical Memorandum, Dec. 2011, 62 pages.

Cai et al., "Design of a Time-Domain Acoustic Contrast Control for Broadband Input Signals in Personal Audio Systems," ICASSP2013, pp. 341-345.

Galvez et al., "Time Domain Optimization of Filters Used in a Loudspeaker Array for Personal Audio," IEEE/ACM Transactions on Audio, Speech, and Language Processing, vol. 23, No. 11, Nov. 2015, pp. 1869-1878.

Chinese Search Report issued in CN Patent Application No. 201680091489.5 dated Jun. 17, 2021.

* cited by examiner

AUDIO PRECOMPENSATION FILTER OPTIMIZED WITH RESPECT TO BRIGHT AND DARK ZONES

TECHNICAL FIELD

The proposed technology generally relates to audio systems and digital audio precompensation, and especially a method and corresponding system for determining filter parameters of an audio precompensation filter for the compensation of an associated sound generating system, as well as corresponding computer program and computer-program product as well as an audio precompensation filter, an audio system and a digital audio signal.

BACKGROUND

Audio reproduction systems are often located in shared spaces, where several potential listeners may be present simultaneously. In many situations, this is not a problem, as the system can be dimensioned and designed in such a way that the acoustical properties of the system are good in all listener locations. There are however situations where not all potential listeners want to listen to the same material at the same sound volume. In an automobile, for instance, perhaps the driver needs to focus on navigating without being disturbed by the music to which the passengers may want to listen. Another example may be watching two different films simultaneously in the same room. A region of space in which no sound from a certain source is desired is often referred to as a 'dark zone', while a region of space in which sound, ideally emulating a desired sound field, from the source is desired is called a 'bright zone'.

The potential of such a system has sparked interest in the research community and a lot of scientific papers have been published on the topic. The most commonly utilized method is called Acoustic Contrast Control (ACC) and is based on maximizing the quotient of bright zone energy over dark zone energy. This approach sometimes encounters problems related to the mathematical tractability of the inversion in the criterion to be maximized. A reformulation, called Energy Difference Maximization (EDM), reposes the problem and maximizes the difference between bright zone energy and dark zone energy, which is mathematically more tractable but does not achieve quite the same level of acoustic separation in the extreme, as ACC does.

Both the ACC method and the EDM method have the sole focus of maximizing acoustical contrast and do not consider the acoustical properties within the bright zone at all. A variety of methods seeking to find a compromise between achieved contrast and good bright zone properties have therefore been developed during the recent years. However, these methods are all prone to pre-ringing or other acoustical artefacts relating to excessively long signal build-up times.

Significant effort has also gone into research on how to produce audio filters that compensates for the sound generation system itself. A solution that generates a causal and stable filter is presented in the European patent EP 2 257 083. This solution will not be limited by invalid assumptions and post-optimization filter fixes but does not explicitly take into consideration the possibility that different source materials or different sound intensities are desired in different spatial locations.

There is thus a general need for improvements in the field of designing audio precompensation filters.

SUMMARY

It is an object to provide a method for determining filter parameters of an audio precompensation filter for the compensation of an associated sound generating system having at least two loudspeakers.

It is also an object to provide a system configured to determine filter parameters of an audio precompensation filter for the compensation of an associated sound generating system having at least two loudspeakers.

Another object is to provide a corresponding computer program for determining, when executed by at least one processor, filter parameters of an audio precompensation filter.

Yet another object is to provide a corresponding computer-program product.

Still another object is to provide an apparatus for determining filter parameters of an audio precompensation filter.

It is also an object to provide a corresponding audio precompensation filter.

Another object is to provide a corresponding audio system comprising a sound generating system and an audio precompensation filter.

Yet another object is to provide a corresponding digital audio signal produced by an audio precompensation filter.

These and other objects are met by embodiments of the proposed technology.

According to a first aspect there is provided a method for determining filter parameters of an audio precompensation filter for the compensation of an associated sound generating system having at least two loudspeakers. The method comprises:

determining sound field models describing the sound field in at least one region of space designated the bright zone and the sound field in at least one region of space designated the dark zone;

determining a target sound field in the bright zone;

determining filter parameters of the audio precompensation filter so that a criterion function is optimized under the constraint of causality and stability of the dynamics of the audio precompensation filter, wherein the criterion function includes at least:

a first term representing a deviation between a compensated sound field in the bright zone and the target sound field in the bright zone; and a second weighted term representing a difference between power in the dark zone and power in the bright zone based on the sound field models of the bright zone and dark zone.

According to a second aspect there is provided a system configured to determine filter parameters of an audio precompensation filter for the compensation of an associated sound generating system having at least two loudspeakers. The system is configured to obtain sound field models describing the sound field in at least one region of space designated the bright zone and the sound field in at least one region of space designated the dark zone. The system is also configured to obtain a target sound field in the bright zone. Further, the system is configured to determine filter parameters of the audio precompensation filter so that a criterion function is optimized under the constraint of causality and stability of the dynamics of the audio precompensation filter, wherein the criterion function includes at least:

a first term representing a deviation between a compensated sound field in the bright zone and the target sound field in the bright zone; and a second weighted term representing a difference between power in the dark zone and power in the bright zone based on the sound field models of the bright zone and dark zone.

According to a third aspect there is provided a computer program for determining, when executed by at least one processor, filter parameters of an audio precompensation filter for the compensation of an associated sound generating system having at least two loudspeakers. The computer program comprises instructions, which when executed by the at least one processor, cause the at least one processor to:
  obtain sound field models describing the sound field in at least one region of space designated the bright zone and the sound field in at least one region of space designated the dark zone;
  obtain a target sound field in the bright zone;
  determine filter parameters of the audio precompensation filter so that a criterion function is optimized under the constraint of causality and stability of the dynamics of the audio precompensation filter to enable reproduction of a desired target sound field in the bright zone, while reproducing as little sound as possible in the dark zone.

According to a fourth aspect there is provided a computer-program product comprising a computer-readable medium having stored thereon such a computer program.

According to a fifth aspect there is provided an apparatus for determining filter parameters of an audio precompensation filter for the compensation of an associated sound generating system having at least two loudspeakers. The apparatus comprises a first module for obtaining sound field models describing the sound field in at least one region of space designated the bright zone and the sound field in at least one region of space designated the dark zone. The apparatus also comprises a second module for obtaining a target sound field in the bright zone. The apparatus further comprises a third module for determining filter parameters of the audio precompensation filter so that a criterion function is optimized under the constraint of causality and stability of the dynamics of the audio precompensation filter, wherein the criterion function includes at least:
  a first term representing a deviation between a compensated sound field in the bright zone and the target sound field in the bright zone; and
  a second weighted term representing a difference between power in the dark zone and power in the bright zone based on the sound field models of the bright zone and dark zone.

According to a sixth aspect there is provided an audio precompensation filter determined by using the method described herein.

According to a seventh aspect there is provided an audio system comprising a sound generating system and such an audio precompensation filter.

According to an eighth aspect there is provided a digital audio signal generated by such an audio precompensation filter.

In this way, it is for example possible to design audio filters which aims at reproducing a desired sound field in one or more physical locations while reproducing as little sound as possible in other locations.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which.

DETAILED DESCRIPTION

Throughout the drawings, the same reference designations are used for similar or corresponding elements.

For a better understanding of the proposed technology, it may be useful to begin with a brief overview of an example of an audio system comprising an audio precompensation filter and an associated sound generating system.

Figure 1:
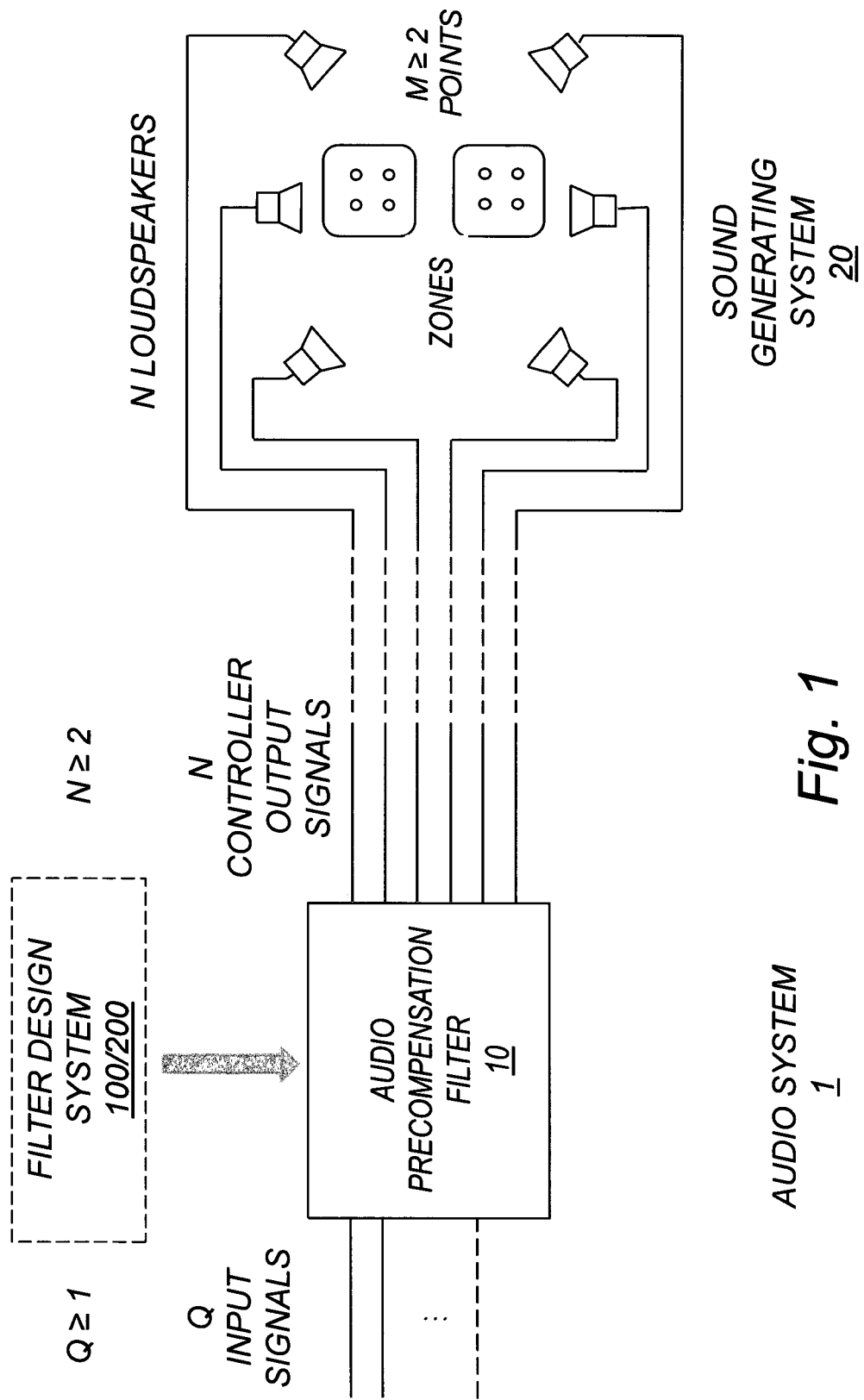
FIG. 1 is a schematic diagram illustrating an example of an audio system.

FIG. 1 is a schematic diagram illustrating an example of an audio system. The audio system 1 comprises an audio precompensation filter 10 and an associated sound generating system 20. The audio precompensation filter 10 is arranged in the input path to the sound generating system 20. The audio precompensation filter has $J \geq 1$ input signals. The sound system comprises $N \geq 2$ loudspeakers and there are a number of zones including a bright zone and a dark zone, as will be explained below. The zones are preferably covered by a total of $M \geq 2$ control points.

In practice, the audio precompensation filter 10 is embodied together with the sound generating system 20 so as to enable generation of sound influenced by the filter.

The proposed technology also relates to a so-called filter design system 100/200 for determining filter parameters of the audio precompensation filter 10.

It may also be useful to continue with a brief problem analysis. The inventor has recognized that a problem with the ACC and EDM methods is that they focus solely on the acoustical contrast (or separation) without consideration of the acoustical properties within the bright zone. Due to this lack of bright zone control, a plethora of methods that in one way or another trade acoustical contrast (typically using the ACC or EDM method) against bright zone control (typically using the Pressure Matching method) have been developed. However, as the inventor realized, these methods all share the characteristics that they are computed without constraints on the causality of the resulting filters. This means that the methods all produce filters that are not intended to be causal. The resulting filters therefore need to be truncated or otherwise manipulated in order to be implemented in a normal audio system. These fixes allow the filters to be realized with arbitrary main impulse delays, offering direct control over the timing of the system response and some, albeit limited and indirect, control of the system pre-ringings. These fixes are, however, applied after the filter optimization stage, and the final filter is therefore unlikely to be optimal. This introduces a limit on the bright zone sound quality, even when the optimization criterion admits a bright zone quality term and the original system has abundant degrees of freedom.

Some work has also been done in the realm of causal filters for personal audio. In the ISVR Technical Memorandum "Regularisation and Robustness of Personal Audio Systems" by Elliott et al, December 2011 the causal counterpart to the ACC criterion was derived. This work was extended in the paper "Design of a Time-Domain Acoustic Contrast Control for Broadband Input Signals in Personal Audio Systems" by Cai et al., ICASSP 2013 to compensate for an artefact of the causal ACC method where the bright zone energy varies dramatically between frequency bands. In the latter paper, this is alleviated by introducing a response variation term in the denominator of the criterion, that aims to increase the frequency-response consistency of the bright zone.

In the paper "Time domain optimization of filters used in a loudspeaker array for personal audio" by Gálvez et al., IEEE Transactions on Audio, Speech, and Language Processing, Vol. 23, November 2015, a causal filter is derived and computed in which a target can be chosen in the bright zone while the sound power in the dark zone is minimized.

Figure 2:
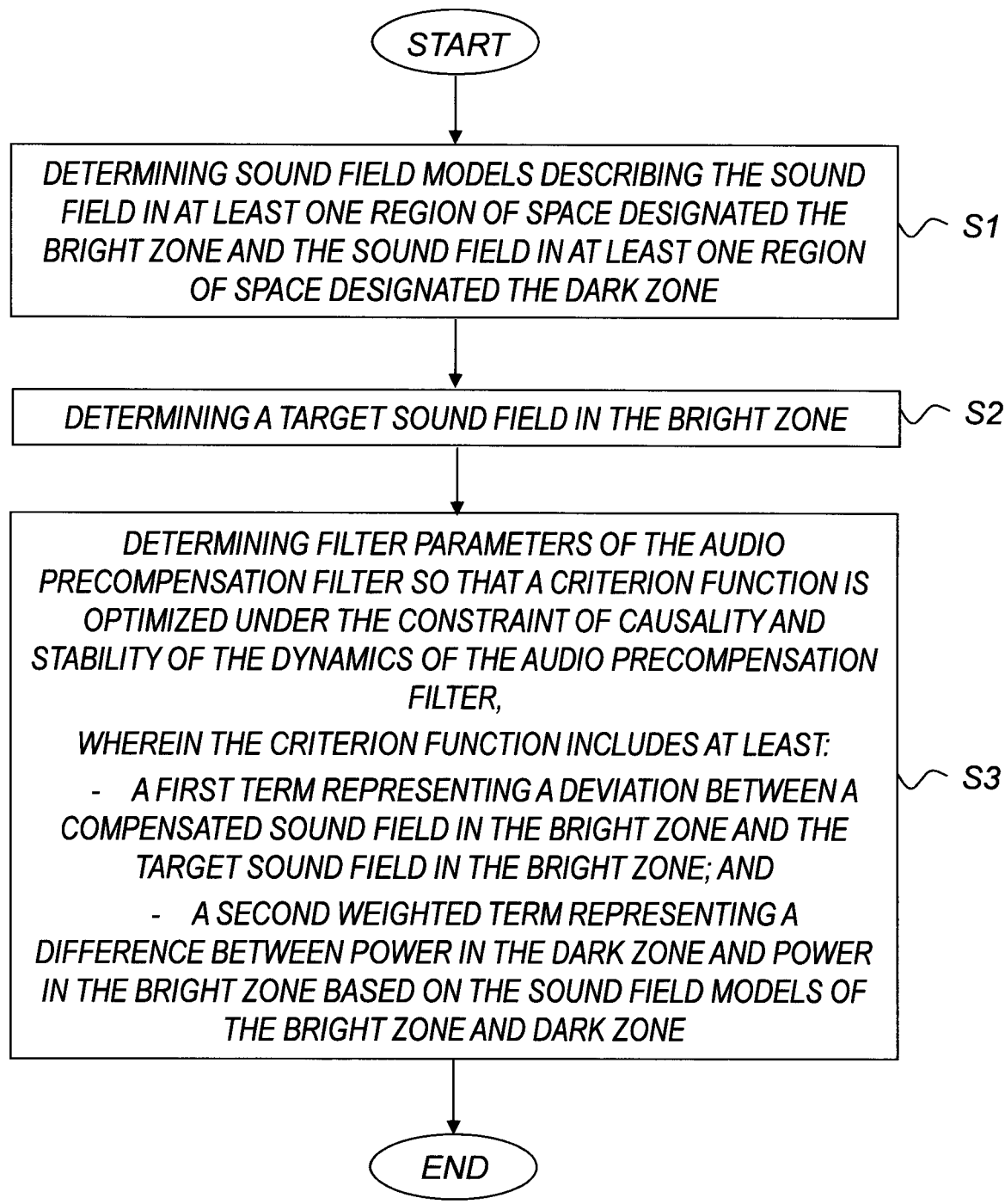
FIG. 2 is a schematic flow diagram illustrating an example of a method for determining filter parameters of an audio precompensation filter for the compensation of an associated sound generating system having at least two loudspeakers.

FIG. 2 is a schematic flow diagram illustrating an example of a method for determining filter parameters of an audio precompensation filter for the compensation of an associated sound generating system having at least two loudspeakers.

Basically, the method comprises the following steps:

S1: determining sound field models describing the sound field in at least one region of space designated the bright zone and the sound field in at least one region of space designated the dark zone.

S2: determining a target sound field in the bright zone.

S3: determining filter parameters of the audio precompensation filter so that a criterion function is optimized under the constraint of causality and stability of the dynamics of the audio precompensation filter, wherein the criterion function includes at least:
  a first term representing a deviation between a compensated sound field in the bright zone and the target sound field in the bright zone; and
  a second weighted term, sometimes referred to as a contrast term, representing a difference between power in the dark zone and power in the bright zone based on the sound field models of the bright zone and dark zone.

Figure 3:
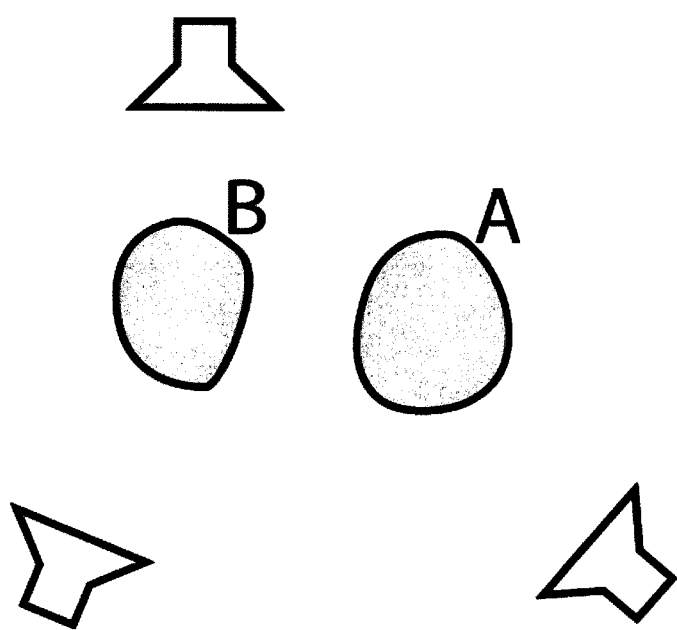
FIG. 3 is a schematic diagram illustrating a typical example where a bright zone and a dark zone are surrounded by a set of loudspeakers.

FIG. 3 is a schematic diagram illustrating a typical example where a bright zone A and a dark zone B are surrounded by a set of loudspeakers. By way of example, the filter generated according to the method described herein may focus on optimizing the contrast between the two zones A, B together with adherence of the sound field in the bright zone A to a desired sound field.

The advantage of optimizing the power difference between the dark zone and the bright zone is that the absolute power level in the dark zone becomes irrelevant, only the relative power in the dark zone to the bright zone matters. This mitigates the conflict of bright zone target adherence and dark zone power minimization.

Figure 4:
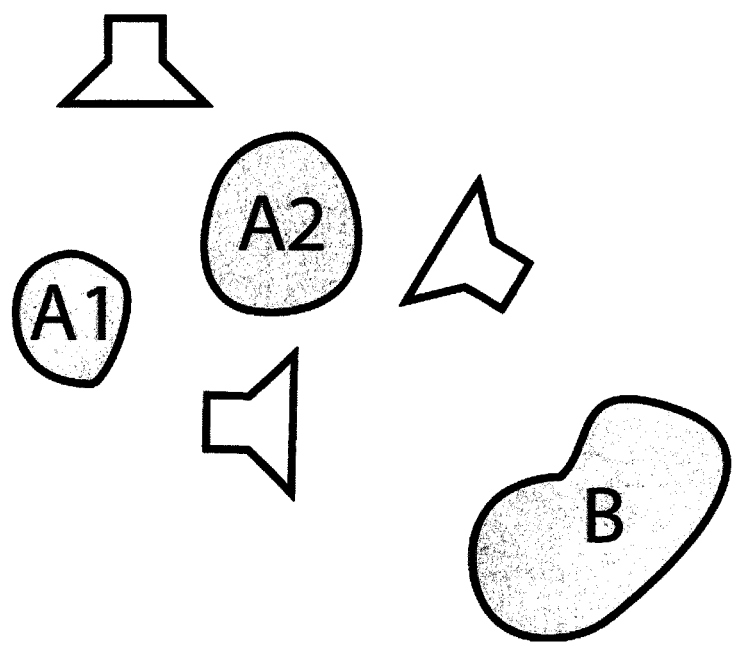
FIG. 4 is a schematic diagram illustrating a more general example where a bright zone is defined by two regions of space and a dark zone is defined by one region of space, and the set of loudspeakers is more generally positioned with respect to the zones.

FIG. 4 is a schematic diagram illustrating a more general example where a bright zone is defined by two regions A1, A2 of space and a dark zone is defined by one region B of space, and the set of loudspeakers is more generally positioned with respect to the zones.

For example, a goal of the design procedure may be to generate a filter that optimizes the acoustical contrast between the bright zone and the dark zone in combination with optimizing the deviation of the sound fields in A1 and A2 from specified respective target sound fields.

In general, the bright zone may be defined as one or more regions of space and the dark may be defined as one or more regions of space. The bright zone and the dark zone typically represent spatially disjoint regions.

As an example, the filter parameters may be determined so that, when the audio precompensation filter is applied to the associated sound generating system, a desired target sound field is reproduced in the bright zone, while reproducing a desired difference in sound pressure between the bright zone and the dark zone. For example, it may be desirable to reproduce as great a difference as possible in sound pressure between the zones, and preferably as little sound as possible in the dark zone.

Optionally, the criterion function further includes a third term representing filter power and penalizing high filter gains.

By way of example, the step of determining the sound field models of the bright zone and dark zone may include estimating, for each one of the loudspeakers, a model transfer function at each of a plurality M of control points distributed in the bright zone and the dark zone.

Preferably, K of the control points relate to the dark zone, while L=M−K of the control points relate to bright zone.

As an example, the step of estimating a model transfer function at each of a plurality M of control points may be based on estimating an impulse response at each of said control points obtained by measuring the response to test signals of said sound generating system.

Figure 5:
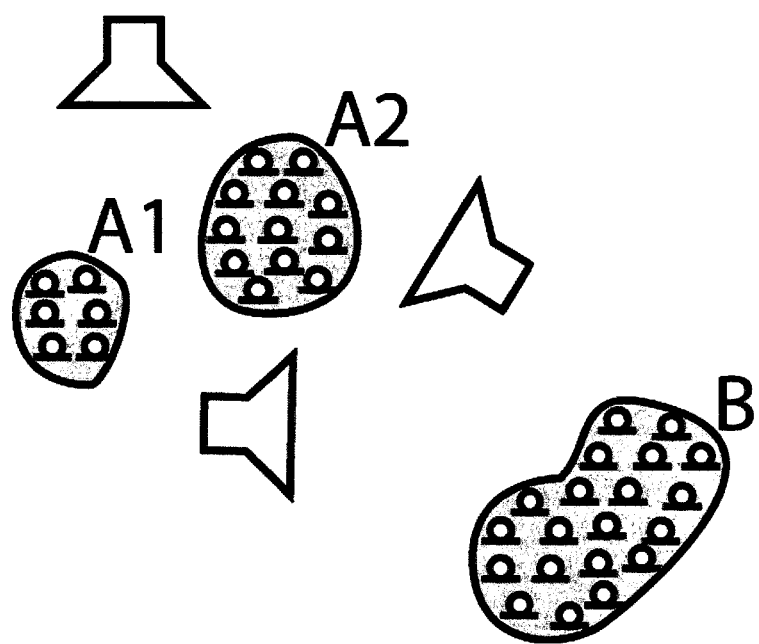
FIG. 5 is a schematic diagram illustrating an example wherein the zones are modelled by a spatial sampling of sound in the designated regions.

FIG. 5 is a schematic diagram illustrating an example wherein the zones are modelled by a spatial sampling of sound in the designated regions.

Alternatively, or as a complement, the step of estimating a model transfer function at each of a plurality M of control points may be based on simulation of an impulse response at each of said control points, wherein said simulation includes first order reflections and/or higher order reflections.

By way of example, the criterion function may include a weighted summation of powers of deviations between compensated model impulse responses and target impulse responses over said M control points.

In a particular example, the criterion function includes, as the second weighted term, the expected value of the difference between the power in the dark zone and the power in the bright zone, as generated by the filtered sound generating system:

$$E\{\lambda(\sigma_D^T\sigma_D - \alpha\sigma_B^T\sigma_B)\} \; \lambda > 0, \; \alpha > 0,$$

where $\lambda$ and $\alpha$ are configurable values, and $\sigma_D = \Phi_D H_D Rr(t)$ in which $\Phi_D$ is a (possibly frequency-dependent) matrix weight for the dark zone, which can be used to emphasize different aspects of the contrast term of the criterion relative to the other terms, the factor $H_D$ represents a model of the system in the dark zone, R is the filter to be optimized and r(t) is the current sample of an input signal, and $\sigma_B = \Phi_B H_B Rr(t)$, wherein $\Phi_B$ is a (possibly frequency-dependent) matrix weight for the bright zone and $H_B$ holds the system model in the bright zone, and T represents the transpose operator.

Optionally, the expected value is taken with respect to a driving noise and with respect to errors, or uncertainties, of the mathematical models describing the sound generating system.

For example, the criterion function may be defined as the scalar function:

$$J = E\{\varepsilon^T\varepsilon + \lambda(\sigma_D^T\sigma_D - \alpha\sigma_B^T\sigma_B)\},$$

where $$\varepsilon = V(H_B R - D)r(t)$$

and D is a matrix including the desired transfer functions for the bright zone control points, and V is a weighting matrix.

By way of example, the weighting matrix V may be used to assign different emphasis to the minimization of the error of certain measurement positions in space and the filter power of certain loudspeakers respectively, at different frequencies.

In another example, the criterion function may be defined as:

$$J = E\{\varepsilon^T\varepsilon + \lambda(\sigma_D^T\sigma_D - \alpha\sigma_B^T\sigma_B) + u^T u\},$$

where $$\varepsilon = V(H_B R - D)r(t),$$

$$u = WRr(t),$$

and D is a matrix including the desired transfer functions for the bright zone control points, and V and W are weighting matrices.

In yet another example, a number k of contrast terms may be used, where k is equal to or greater than 2. In this example, the criterion function may thus be defined as:

$$J = E\left\{\varepsilon^T\varepsilon + \sum_k \lambda_k(\sigma_{D_k}^T\sigma_{D_k} - \alpha_k\sigma_{B_k}^T\sigma_{B_k}) + u^T u\right\}$$

where k contrast terms are used, and where:

$$\varepsilon = V(H_B R - D)r(t),$$

$$u = WRr(t),$$

$$\lambda_k > 0,$$

$$\alpha_k > 0,$$

$$\sigma_{D_k} = \Phi_{D_k} H_D Rr(t)$$

$$\sigma_{B_k} = \Phi_{B_k} H_B Rr(t).$$

In the above examples, the weighting matrix V and/or W may be used to assign different emphasis to the minimization of the error of certain measurement positions in space and the filter power of certain loudspeakers respectively, at different frequencies.

The criterion function is bounded from below if the equation:

$$E\left\{(VH_B Rr(t))^T VH_B Rr(t) + \sum_k \lambda_k(\sigma_D^T\sigma_D - \alpha\sigma_B^T\sigma_B) + u^T u\right\}$$

is greater than zero for all nonzero filters R. Choosing $W = \varrho P$ where P is a matrix such that $x^T(H_D^T H_D - \alpha H_B^T H_B)x < 0 \Rightarrow Px \neq 0$ for any vector $x \neq 0$ and $H_B$ and $H_D$ are transfer functions for the bright zone and dark zone respectively, we can guarantee this to be true for a sufficiently large value of $\varrho$.

Optionally, the parameters $\lambda$ and/or $\Phi$ may be iteratively determined.

As mentioned, the bright zone and the dark zone typically represent spatially disjoint regions.

In a particular application example, when using beam-forming-capable loudspeakers, the bright zone may be defined by at least one region representing sound beam directions relative to the loudspeakers in which loudspeaker output power is to be transmitted and the dark zone may be defined by at least one region representing sound beam directions relative to the loudspeakers in which loudspeaker output power is to be avoided.

Figure 6:
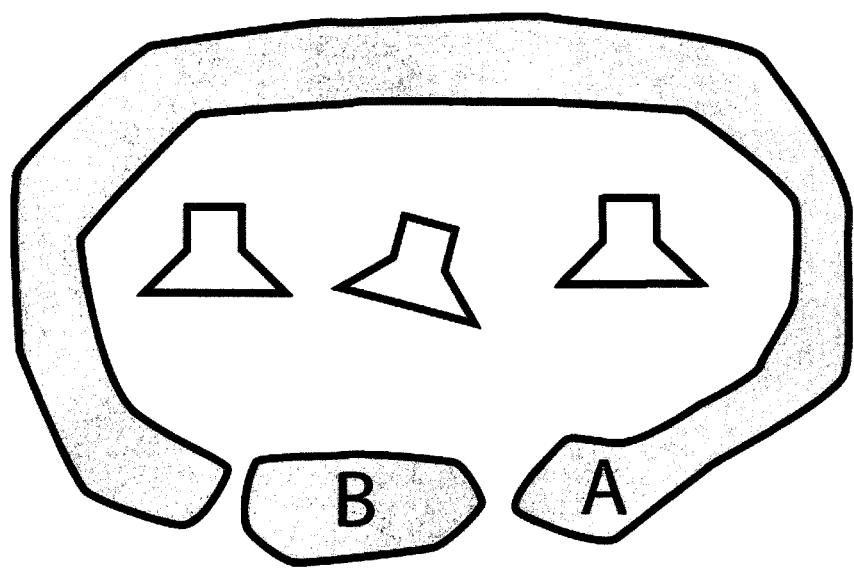
FIG. 6 is a schematic diagram illustrating a typical example where a dark zone is defined to block or at least limit sound from escaping in the direction(s) where sound is not desired, and a bright zone is defined to enable focusing of sound in the direction(s) where sound is desired.

FIG. 6 is a schematic diagram illustrating a typical example where a dark zone, in this example denoted A, is defined to block or at least limit sound from escaping in the direction(s) where sound is not desired, and a bright zone, in this example denoted B, is defined to enable focusing of sound in the direction(s) where sound is desired. Omitting a certain area or region from all zones implies that we are indifferent as to whether the sound pressure level is high or low in that area or region.

In general, the bright zone may include one or more regions and the dark zone may include one or more regions, as previously discussed.

In a particular example, the bright zone may include at least two physically separate regions and/or the dark zone may include at least two physically separate regions, where a desired target sound field is specified in each of these regions.

It should be understood that the target sound field in the bright zone can be (freely) specified with respect to both temporal and spectral behavior.

In a particular example, the target sound field in the bright zone may be specified by a time-domain model.

In another example, the criterion function is described exclusively by time-domain models and variables.

A detailed description of the proposed technology with reference to various non-limiting exemplary embodiments now follows.

In the context of the present invention, a zone is associated with a region such as a volume or surface of space, the acoustical properties of which are captured by a mathematical model.

It should be understood that the first term may include at least two differently weighted sub-terms and/or the second term may include at least two differently weighted sub-terms, as will be exemplified later on.

The proposed technology provides a filter design strategy that focuses on generating a filter by means of minimization of a criterion under constraints on causality and stability of the resulting filter. By way of example, the constraint includes, as a (weighted) term, the expected value of the difference between the power in the dark zone and the power in the bright zone, both as generated by the electro-acoustical system.

$$E\{\lambda(\sigma_D^T\sigma_D - \alpha\sigma_B^T\sigma_B)\}\ \lambda > 0,\ \alpha > 0.$$

Above, $\sigma_D = \Phi_D H_D Rr(t)$ in which $\Phi_D$ is a (possibly frequency dependent) matrix weight for the dark zone, which can be used to emphasize different aspects of the contrast term of the criterion relative to the other terms. The factor $H_D$ represents a model of the system in the dark zone, R is the filter to be optimized and r(t) is the current sample of an input signal. Similarly, $\sigma_B = \Phi_B H_B Rr(t)$, wherein $H_B$ holds the system model in the bright zone and $\Phi_B$ is a (possibly frequency dependent) matrix weight for the bright zone.

The expected value, E{.}, is taken with respect to a driving noise and with respect to errors, or uncertainties, of the mathematical models describing the system.

This part of the criterion can be seen as the causal counterpart to the EDM method (but with negated sign, so that a minimization of the criterion yields the desired result). The EDM criterion would be, for every frequency bin in which it is defined:

$$q^H \left( \frac{1}{M_B} H_B^H H_B - \frac{1}{M_D} H_D^H H_D \right) q$$

wherein q is the filter vector to be optimized and $M_X$ is a number of discreet measurement positions in zone X. The difference between the EDM criterion and the present criterion is greater than it may seem at first glance, as the current criterion is expressed in the time domain whereas the EDM criterion is expressed in the frequency domain. Computing the criterion bin-by-bin in the frequency domain as above neglects the co-dependence between frequency bins that relate to a temporally sound, causal filter Since causality is included as a constraint in the proposed filter optimization step, the method yields realizable filters with explicit control over the time-domain properties of the solution. As there is no need for post-optimization fixes, the final implemented filter can be optimal in the originally intended sense.

For example, the design procedure may be as follows:
1. The system-to-be-treated, henceforth original system, is specified and dark and bright zones are designated. This is a mathematical representation of how the electro-acoustical system behaves without the filters-to-be-designed. There is a number of ways in which this mathematical model can be acquired.
2. The other parts of the criterion, not dealing with acoustical zones, are defined as needed. In the normal case, one term defining the desired bright zone behavior and one term penalizing high filter gains would be included in the criterion.
3. The design equations are not necessarily solvable unless the criterion is bounded from below, this must therefore be checked. If it is not bounded from below, the scalar multiplier that weighs the personal audio part of the criterion can be reduced.
4. The filter(s) is computed.
5. No tweaking is necessary but It is possible to alter the coloration of the filter here.

Example—Polynomial Matrix Design

As an example, polynomial matrices have previously been efficiently utilized in design and implementation of general causal filters. In this example, we design a causal filter which weighs acoustical contrast against both the bright zone sound field properties and the filter power throughput.

Consider an electro-acoustical system with N loudspeakers, the transfer functions of which are estimated by point measurements in 2M measurement positions. M of these positions define the intended dark zone, while the other M define the intended bright zone.

Here, polynomials in the delay operator $q^{-1}$, $q^{-1}y(t)=y(t-1)$, are used. The corresponding time advancement operator is q, $qy(t)=y(t+1)$. These polynomials constitute the elements of polynomial matrices and rational matrices. The polynomial and rational matrices can be transposed, conjugated (i.e. substituting q for $q^{-1}$ and vice versa), or both. Transpose is denoted by superscript 'T', $A^T(q^{-1})$ and conjugate transpose by subscript '*' $A_*(q)$.

Figure 7:
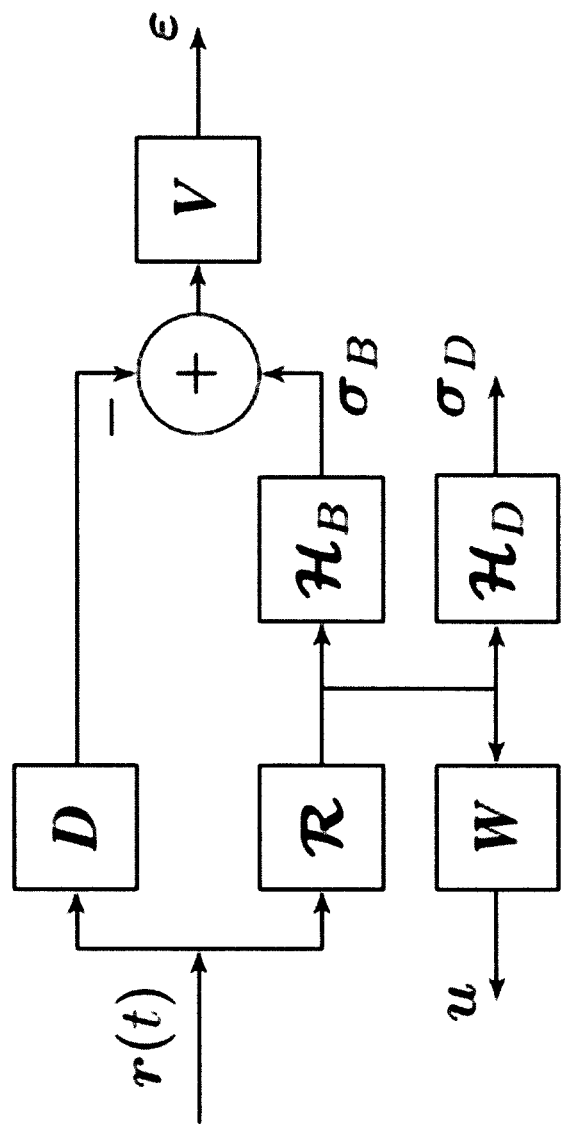
FIG. 7 is a schematic diagram illustrating an example of a block representation of a constrained filter system according to a particular embodiment.

FIG. 7 is a schematic diagram illustrating an example of a block representation of a constrained filter system according to a particular embodiment.

The bright zone is modelled by a rational delay operator matrix, $H_B$. The dark zone is similarly modelled by the rational matrix $H_D$. These modelling matrices can be rewritten, using a right matrix fraction description as $H_B = B_B A^{-1}$, $H_D = B_D A^{-1}$. Note that the denominator matrix is common to both the bright and dark zone, this is physically motivated by the fact that the modes of the acoustical system are common for the entire room. The Q|1 driving noise vector, r(t), is here modelled by a colored, zero mean noise as r(t)=Fv(t) where F is a stable, invertible rational matrix and v(t) a white, zero mean, Gaussian noise. The filter we are to design is applied to the signal before it is fed through the electro-acoustical system.

We can therefore model the filtered sound at the measurement positions as $$z_B = B_B A^{-1} Rr(t),$$

$$z_D = B_D A^{-1} Rr(t).$$

These are the models on which the optimization is based. In this particular example, a criterion comprising a term describing the difference between a desired bright zone behavior and the filtered system model and a term describing the filter power in addition to the contrast term described above is chosen. The criterion to be minimized is thus $$J = E\{\varepsilon^T\varepsilon + \lambda(\sigma_D^T\sigma_D - \alpha\sigma_B^T\sigma_B) + u^T u\},$$

where $$\sigma_D = \Phi_D H_D Rr(t) = \Phi_D B_D A^{-1} RF_1 N^{-1} v(t),$$

$$\sigma_B = \Phi_B H_B Rr(t) = \Phi_B B_B A^{-1} RF_1 N^{-1} v(t),$$

$$\varepsilon = V(H_B R - D)r(t) = V(B_B A^{-1} R - D_1 E^{-1})F_1 N^{-1} v(t),$$

$$u = WRr(t) = WRF_1 N^{-1} v(t).$$

The above equations rely on the right matrix factorization of $F = F_1 N^{-1}$ and $D = D_1 E^{-1}$ where $F_1$, N and E are all assumed to have stable and causal inverses.

The rational matrix, D contains the desired transfer functions for all M bright zone measurement positions, V and W are weighting matrices used to assign different emphasis to the minimization of the error of certain measurement positions in space and the filter power of certain loudspeakers respectively, at different frequencies. The above criterion is bounded from below if $$E\{(VH_BRr(t))^T VH_BRr(t) + \lambda(\sigma_D^T\sigma_D - \alpha\sigma_B^T\sigma_B) + u^T u\}$$

is greater than zero for all nonzero filters R. Choosing W= $\mathbf{Q}$ P where P is a matrix such that $x^T(H_D^T H_D - \alpha H_B^T H_B)$ $x < 0 \Rightarrow Px \neq 0$ for any vector $x \neq 0$, we can guarantee this to be true for a sufficiently large value of $\mathbf{Q}$.

The filter or controller R that minimizes the criterion J above is found as the solution to $$R = A\beta^{-1} S E_2^{-1} F_1^{-1},$$

where $E_2$ is found together with $F_2$ as the solution to the right coprime factorization $E^{-1}F_1 = F_2 E_2^{-1}$, and S is found together with the strictly non-causal polynomial matrix $L_*$ as the solution to the bilateral Diophantine equation $$\beta_* S = B_{B*} V_* V D F_2 + L_* q N E_2.$$

The polynomial matrix $\beta$ is found through a spectral factorization of the equation $$\beta_*\beta = B_{B*}V_*VB_B + \lambda(B_{D*}\Phi_{D*}\Phi_D B_D - \alpha B_{B*}\Phi_{B*}\Phi_B B_B) + A_*W_*WA.$$

It is assumed that $\beta_*\beta$ can be factorized into a completely causal and a completely anti-causal factor, $\beta$ and $\beta_*$ respectively.

Figure 8:
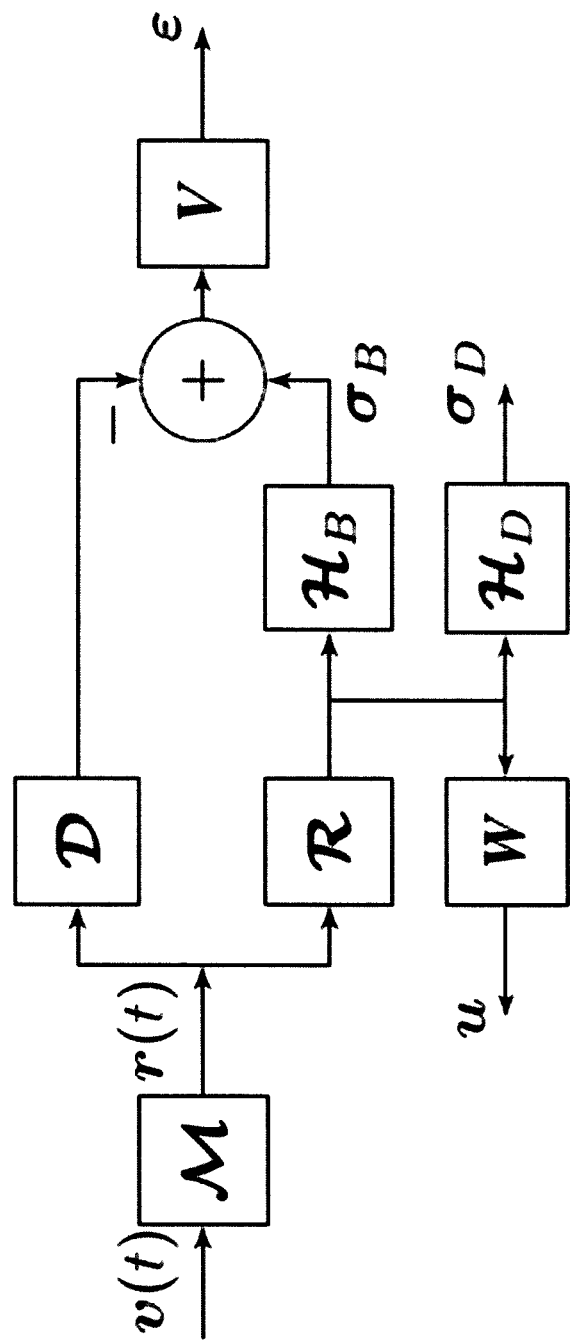
FIG. 8 is a schematic diagram illustrating an example of a block representation of a constrained filter system according to another particular embodiment.

FIG. 8 is a schematic diagram illustrating an example of a block representation of a constrained filter system according to another particular embodiment.

Figure 9A:
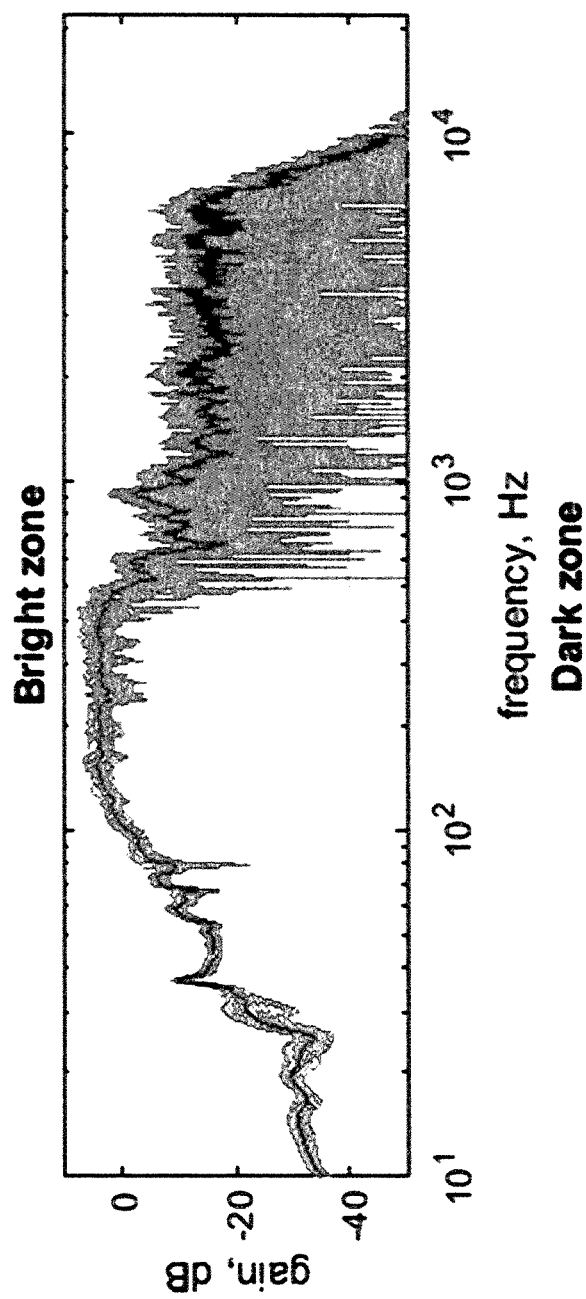
FIGS. 9A and 9B are schematic curve diagrams illustrating gain/power versus frequency for the bright zone and the dark zone, respectively, according to a particular simulation example.
Figure 9B:
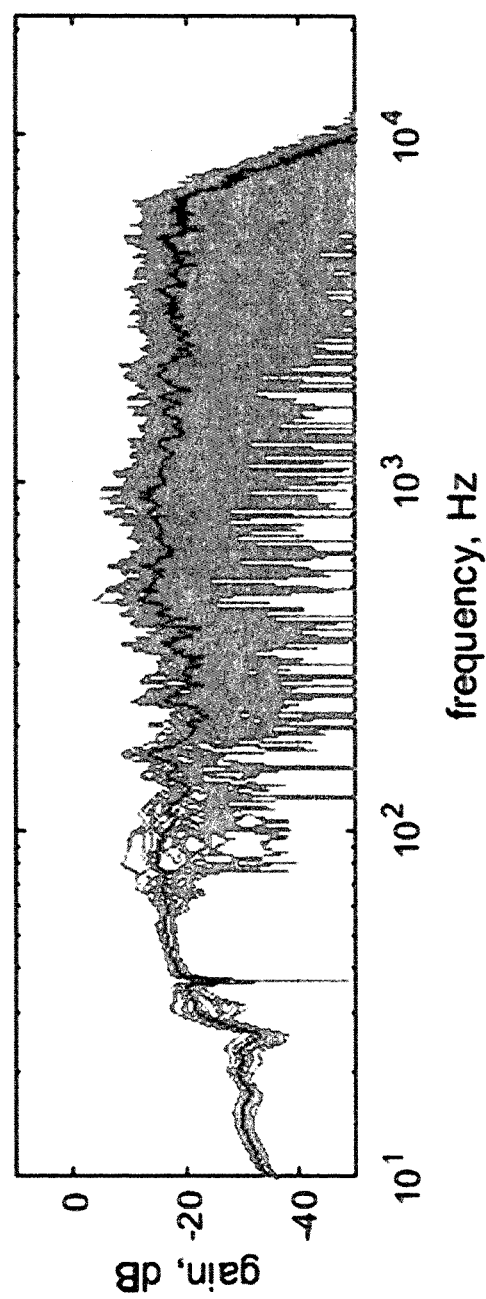

FIGS. 9A and 9B are schematic curve diagrams illustrating gain versus frequency for the bright zone and the dark zone, respectively, according to a particular simulation example.

Several input signals, Q>1, can be accommodated, e.g. by expanding the target sound field model, D, to accommodate several sound fields (one for each input channel, r(t) is then a Q|1 vector). This implicitly assumes that the weights, V, W, $\Phi_B$ and $\Phi_D$, are the same for every input channel in the optimization. Another method of taking several input channels into consideration is by first computing several single channel filters and use each of these filters for the intended input channels. The output signal to be fed to each speaker is then simply the sum of all filter's output signals for that speaker. The latter method is more flexible in that different weights for the different filter optimization aspects can be used when computing the different filters serving the different input channels.

It will be appreciated that the methods and systems described herein can be implemented, combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Alternatively, or as a complement, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

According to an aspect there is provided a system configured to determine filter parameters of an audio precompensation filter for the compensation of an associated sound generating system having at least two loudspeakers. The system is configured to obtain sound field models describing the sound field in at least one region of space designated the bright zone and the sound field in at least one region of space designated the dark zone. The system is also configured to obtain a target sound field in the bright zone. Further, the system is configured to determine filter parameters of the audio precompensation filter so that a criterion function is optimized under the constraint of causality and stability of the dynamics of the audio precompensation filter, wherein the criterion function includes at least:

a first term representing a deviation between a compensated sound field in the bright zone and the target sound field in the bright zone; and a second weighted term representing a difference between power in the dark zone and power in the bright zone based on the sound field models of the bright zone and dark zone.

Optionally, the criterion function further includes a third term representing filter power and penalizing high filter gains.

By way of example, the system may be configured to obtain the sound field models of the bright zone and dark zone by estimating, for each one of the loudspeakers, a model transfer function at each of a plurality of control points distributed in the bright zone and the dark zone.

For example, the system may be configured to estimate a model transfer function at each of a plurality M of control points based on estimating an impulse response at each of said control points obtained by measuring the response to test signals of said sound generating system.

Alternatively, or as a complement, the system may be configured to estimate a model transfer function at each of a plurality M of control points based on simulation of an impulse response at each of said control points, wherein said simulation includes first order reflections and/or higher order reflections.

It is also possible for the system to receive the sound field models of the bright zone and dark zone from an external source.

As an example, the criterion function may include a weighted summation of powers of deviations between compensated model impulse responses and target impulse responses over said M control points.

In a particular example, the criterion function includes, as the second weighted term, the expected value of the difference between the power in the dark zone and the power in the bright zone, as generated by the filtered sound generating system:

$$E\{\lambda(\sigma_D^T\sigma_D - \alpha\sigma_B^T\sigma_B)\} \; \lambda>0, \; \alpha>0,$$

where $\lambda$ and $\alpha$ are configurable values, and $\sigma_D = \Phi_D H_D Rr(t)$ in which $\Phi_D$ is a (possibly frequency-dependent) matrix weight for the dark zone, which can be used to emphasize different aspects of the contrast term of the criterion relative to the other terms, the factor $H_D$ represents a model of the system in the dark zone, R is the filter to be optimized and r(t) is the current sample of an input signal, and $\sigma_B = \Phi_B H_B R r(t)$, wherein $H_B$ holds the system model in the bright zone, and T represents the transpose operator and $\Phi_B$ is a (possibly frequency dependent) matrix weight for the bright zone.

For example, the criterion function may be defined as:

$$J = E\{\varepsilon^T \varepsilon + \lambda(\sigma_D^T \sigma_D - \alpha \sigma_B^T \sigma_B)\},$$

where $$\varepsilon = V(H_B R - D) r(t)$$

and D is a matrix including the desired transfer functions for the bright zone control points, and V is a weighting matrix.

In another example, the criterion function may be defined as:

$$J = E\{\varepsilon^T \varepsilon + \lambda(\sigma_D^T \sigma_D - \alpha \sigma_B^T \sigma_B)\},$$

where $$\varepsilon = V(H_B R - D) r(t),$$

$$u = W R r(t),$$

and D is a matrix including the desired transfer functions for the bright zone control points, and V and W are weighting matrices.

In yet another example, the criterion function may be defined as:

$$J = E\left\{\varepsilon^T \varepsilon + \sum_k \lambda_k (\sigma_{D_k}^T \sigma_{D_k} - a_k \sigma_{B_k}^T \sigma_{B_k}) + u^T u\right\}$$

where $k \geq 2$ contrast terms are used, and where:

$$\varepsilon = V(H_B R - D) r(t),$$

$$u = W R r(t),$$

$$\lambda_k > 0,$$

$$\alpha_k > 0,$$

$$\sigma_{D_k} = \Phi_{D_k} H_D R r(t)$$

$$\sigma_{B_k} = \Phi_{B_k} H_B R r(t).$$

Figure 10:
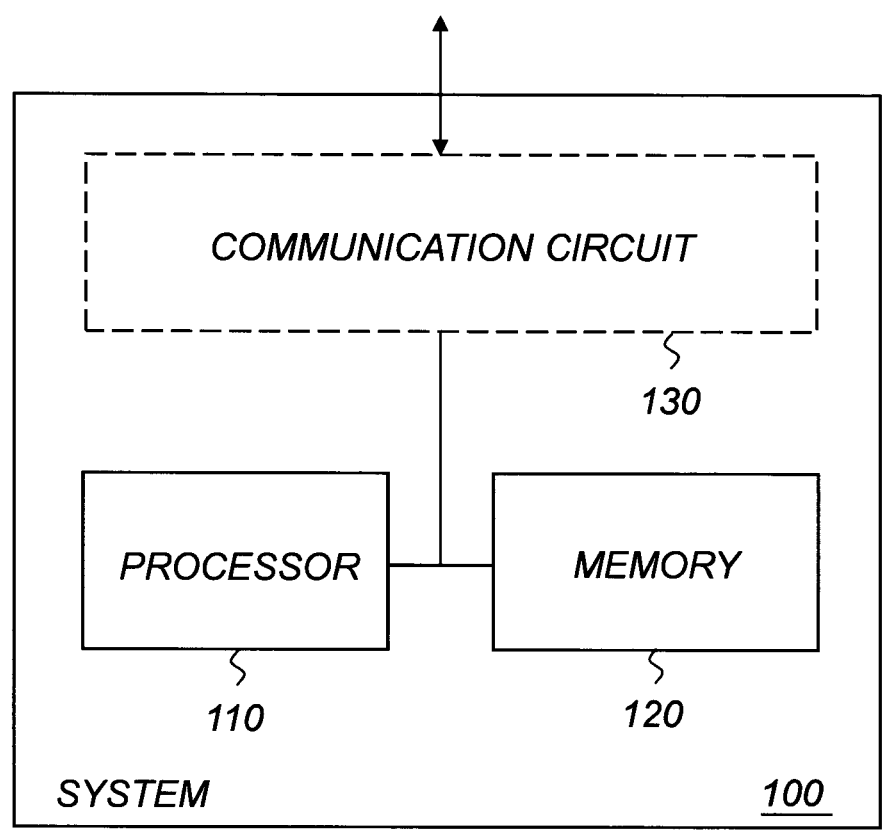
FIG. 10 is a schematic block diagram illustrating an example of a system based on a processor-memory implementation according to an embodiment.

FIG. 10 is a schematic block diagram illustrating an example of a system 100, based on a processor-memory implementation according to an embodiment. In this particular example, the system 100 comprises at least one processor 110 and a memory 120, the memory 120 comprising instructions executable by the processor 110, whereby the processor is operative to determine filter parameters of an audio precompensation filter.

The system 100 may also include an input/output unit 130 to enable input and/or output of relevant data such as input parameter(s) and/or resulting output parameter(s).

It is also possible to provide a solution based on a combination of hardware and software. The actual hardware-software partitioning can be decided by a system designer based on a number of factors including processing speed, cost of implementation and other requirements.

Figure 11:
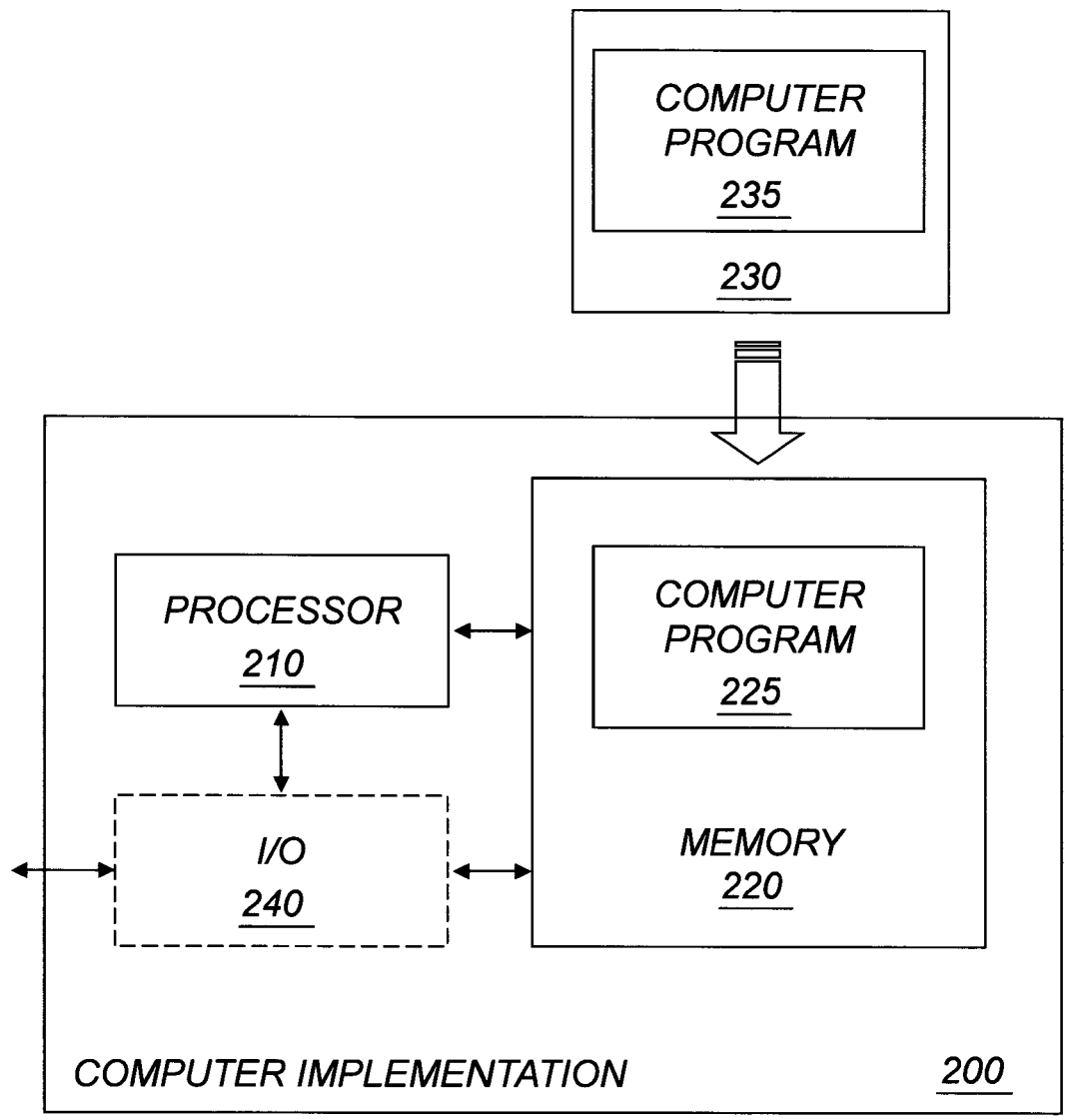
FIG. 11 is a schematic diagram illustrating an example of a computer-implementation 200 according to an embodiment.

FIG. 11 is a schematic diagram illustrating an example of a computer-implementation 200 according to an embodiment. In this particular example, at least some of the steps, functions, procedures, modules and/or blocks described herein are implemented in a computer program 225; 235, which is loaded into the memory 220 for execution by processing circuitry including one or more processors 210. The processor(s) 210 and memory 220 are interconnected to each other to enable normal software execution. An input/output device 240 may also be interconnected to the processor(s) 210 and/or the memory 220 to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors 210 is thus configured to perform, when executing the computer program 225, well-defined processing tasks such as those described herein.

The processing circuitry does not have to be dedicated to only execute the above-described steps, functions, procedure and/or blocks, but may also execute other tasks.

In a particular embodiment, the computer program 225; 235 comprises instructions, which when executed by at least one processor 210, cause the processor(s) 210 to:
 obtain sound field models describing the sound field in at least one region of space designated the bright zone and the sound field in at least one region of space designated the dark zone;
 obtain a target sound field in the bright zone;
 determine filter parameters of the audio precompensation filter so that a criterion function is optimized under the constraint of causality and stability of the dynamics of the audio precompensation filter to enable reproduction of a desired target sound field in the bright zone, while reproducing as little sound as possible in the dark zone.

Preferably, the criterion function includes at least:
 a first term representing a deviation between a compensated sound field in the bright zone and the target sound field in the bright zone; and
 a second weighted term representing a difference between power in the dark zone and power in the bright zone based on the sound field models of the bright zone and dark zone.

By way of example, the software or computer program 225; 235 may be realized as a computer program product, which is normally carried or stored on a computer-readable medium 220; 230, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

In other words, a filter design program implementing a filter design algorithm according to the proposed technology, possibly together with other relevant program modules, may be stored in peripheral memory 230 and loaded into a system memory 220 for execution by a processor 210. Given the relevant input data, the filter design program may calculate the filter parameters of the audio precompensation filter.

The determined filter parameters are then normally transferred from the system memory 220 via the I/O interface 240 to the audio precompensation filter 10 (see FIG. 1), also referred to as an audio precompensation controller.

By way of example, the audio precompensation filter 10 may be based on a digital signal processor (DSP) or similar processing unit, or equivalent processor, and one or more memory modules for holding the filter parameters and the delayed signal samples. The memory module(s) normally also includes a filtering program, which when executed by the processor, performs the actual filtering based on the filter parameters.

Instead of transferring the calculated filter parameters directly to the audio precompensation filter 10 via the I/O system 240, the filter parameters may be stored on a peripheral memory card or memory disk for later distribution to the audio precompensation filter, which may or may not be remotely located from the filter design system 100/200. The calculated filter parameters may also be downloaded from a remote location, e.g. via the Internet, and then preferably in encrypted form.

In order to enable measurements of sound produced by the sound system under consideration, any conventional microphone unit(s) or similar recording equipment may be connected to the computer system 100/200, typically via an analog-to-digital (A/D) converter (not shown).

The audio precompensation filter 10 may be realized as a standalone equipment in a digital signal processor or computer that has an analog or digital interface to the subsequent amplifiers, as mentioned above. Alternatively, it may be integrated into the construction of a digital preamplifier, a D/A converter, a computer sound card, a compact stereo system, a home cinema system, a computer game console, a TV, an MP3 player docking station, a smartphone, a tablet, a laptop computer, or any other device or system aimed at producing sound. It is also possible to realize the precompensation filter in a more hardware-oriented manner, with customized computational hardware structures, such as FPGAs or ASICs.

It should also be understood that the precompensation may be performed separate from the distribution of the sound signal to the actual place of reproduction. The precompensation signal generated by the audio precompensation filter 10 does not necessarily have to be distributed immediately to and in direct connection with the sound generating system 20, but may be recorded on a separate medium for later distribution to the sound generating system 20. The precompensation signal could then represent, for example, recorded music on a CD or DVD disk that has been adjusted to a particular audio equipment and listening environment. It can also be a precompensated audio file stored on an Internet server for allowing subsequent downloading or streaming of the file to a remote location over the Internet.

Accordingly, there is provided an audio precompensation filter determined by using the method described herein, as well as an audio system comprising a sound generating system and such an audio precompensation filter, and also a digital audio signal generated by such an audio precompensation filter.

The flow diagram presented herein may be regarded as a computer flow diagram or diagrams, when performed by one or more processors. A corresponding apparatus may be defined as a group of function modules, where each step performed by the processor corresponds to a function module. In this case, the function modules are implemented as a computer program running on the processor.

The computer program residing in memory may thus be organized as appropriate function modules configured to perform, when executed by the processor, at least part of the steps and/or tasks described herein.

Figure 12:
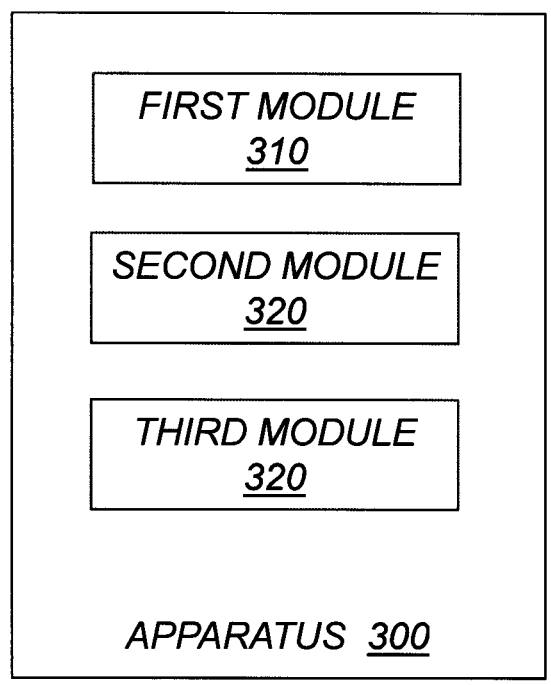
FIG. 12 is a schematic diagram illustrating an example of an apparatus 300 for determining filter parameters of an audio precompensation filter for the compensation of an associated sound generating system having at least two loudspeakers.

FIG. 12 is a schematic diagram illustrating an example of an apparatus 300 for determining filter parameters of an audio precompensation filter for the compensation of an associated sound generating system having at least two loudspeakers.

The apparatus 300 comprises a first module 310 for obtaining sound field models describing the sound field in at least one region of space designated the bright zone and the sound field in at least one region of space designated the dark zone.

The apparatus 300 also comprises a second module 320 for obtaining a target sound field in the bright zone.

The apparatus 300 further comprises a third module 330 for determining filter parameters of the audio precompensation filter so that a criterion function is optimized under the constraint of causality and stability of the dynamics of the audio precompensation filter, wherein the criterion function includes at least:
  a first term representing a deviation between a compensated sound field in the bright zone and the target sound field in the bright zone; and
  a second weighted term representing a difference between power in the dark zone and power in the bright zone based on the sound field models of the bright zone and dark zone.

Alternatively it is possible to realize the module(s) in FIG. 12 predominantly by hardware modules, or alternatively by hardware, with suitable interconnections between relevant modules. Particular examples include one or more suitably configured digital signal processors and other known electronic circuits, e.g. discrete logic gates interconnected to perform a specialized function, and/or Application Specific Integrated Circuits (ASICs) as previously mentioned. Other examples of usable hardware include input/output (I/O) circuitry and/or circuitry for receiving and/or sending signals. The extent of software versus hardware is purely implementation selection.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. A method for determining filter parameters of an audio precompensation filter for the compensation of an associated sound generating system having at least two loudspeakers, wherein said method comprises:
  determining sound field models describing the sound field in at least one region of space designated the bright zone and the sound field in at least one region of space designated the dark zone;
  determining a target sound field in the bright zone;
  determining filter parameters of the audio precompensation filter so that a criterion function is optimized under the constraint of causality and stability of the dynamics of the audio precompensation filter, wherein the criterion function includes at least:
    a first term representing a deviation between a compensated sound field in the bright zone and the target sound field in the bright zone; and a second weighted term representing a difference between power in the dark zone and power in the bright zone based on the sound field models of the bright zone and dark zone, wherein the criterion function further includes a third term representing filter power and penalizing high filter gains.

2. A method for determining filter parameters of an audio precompensation filter for the compensation of an associated sound generating system having at least two loudspeakers, wherein said method comprises:

determining sound field models describing the sound field in at least one region of space designated the bright zone and the sound field in at least one region of space designated the dark zone;

determining a target sound field in the bright zone;

determining filter parameters of the audio precompensation filter so that a criterion function is optimized under the constraint of causality and stability of the dynamics of the audio precompensation filter, wherein the criterion function includes at least:

a first term representing a deviation between a compensated sound field in the bright zone and the target sound field in the bright zone; and a second weighted term representing a difference between power in the dark zone and power in the bright zone based on the sound field models of the bright zone and dark zone, wherein the criterion function includes, as the second weighted term, an expected value of the difference between the power in the dark zone and the power in the bright zone, as generated by the filtered sound generating system:

$$E\{\lambda(\sigma_D^T\sigma_D - \alpha\sigma_B^T\sigma_B)\} \; \lambda > 0, \; \alpha > 0,$$

where $\lambda$ and $\alpha$ are configurable values, and $\sigma_D = \Phi_D H_D R r(t)$ in which $\Phi_D$ is a matrix weight for the dark zone, which can be used to emphasize different aspects of the contrast term of the criterion relative to the other terms, the factor $H_D$ represents a model of the system in the dark zone, R is the filter to be optimized and $r(t)$ is the current sample of an input signal, and $\sigma_B = \Phi_B H_B R r(t)$, wherein $H_B$ holds the system model in the bright zone, and T represents the transpose operator and $\Phi_B$ is a matrix weight for the bright zone.

3. The method of claim 2, wherein the criterion function is defined as:

$$J = E\{\varepsilon^T\varepsilon + \lambda(\sigma_D^T\sigma_D - \alpha\sigma_B^T\sigma_B)\},$$

where $$\varepsilon = V(H_B R - D)r(t)$$

and D is a matrix including the desired transfer functions for the bright zone control points, and V is a weighting matrix.

4. The method of claim 2, wherein the criterion function is defined as:

$$J = E\{\varepsilon^T\varepsilon + \lambda(\sigma_D^T\sigma_D - \alpha\sigma_B^T\sigma_B) + u^T u\},$$

where $$\varepsilon = V(H_B R - D)r(t),$$

$$u = WRr(t),$$

and D is a matrix including the desired transfer functions for the bright zone control points, and V and W are weighting matrices.

5. The method of claim 2, wherein the criterion function is defined as:

$$J = E\left\{\varepsilon^T\varepsilon + \sum_k \lambda_k(\sigma_{D_k}^T\sigma_{D_k} - a_k\sigma_{B_k}^T\sigma_{B_k}) + u^T u\right\}$$

where k contrast terms are used, and where:

$$\varepsilon = V(H_B R - D)r(t),$$

$$u = WRr(t),$$

$$\lambda_k > 0,$$

$$a_k > 0,$$

$$\sigma_{D_k} = \Phi_{D_k} H_D R r(t)$$

$$\sigma_{B_k} = \Phi_{B_k} H_B R r(t).$$

6. The method of claim 4, wherein the criterion function is bounded from below if the equation:

$$E\left\{(VH_B Rr(t))^T VH_B Rr(t) + \sum_k \lambda_k(\sigma_D^T\sigma_D - \alpha\sigma_B^T\sigma_B) + u^T u\right\}$$

is greater than zero for all nonzero filters R, and wherein W is selected as $W = QP$ to guarantee this to be true for a sufficiently large value of $Q$, where P is a matrix such that $x^T(H_D^T H_D - \alpha H_B^T H_B)x < 0 \rightarrow Px \neq 0$ for any vector $x \neq 0$ and $H_B$ and $H_D$ are transfer functions for the bright zone and dark zone respectively.

7. A system configured to determine filter parameters of an audio precompensation filter for the compensation of an associated sound generating system having at least two loudspeakers, wherein the system is configured to obtain sound field models describing the sound field in at least one region of space designated the bright zone and the sound field in at least one region of space designated the dark zone;

wherein the system is configured to obtain a target sound field in the bright zone;

wherein the system is configured to determine filter parameters of the audio precompensation filter so that a criterion function is optimized under the constraint of causality and stability of the dynamics of the audio precompensation filter, wherein the criterion function includes at least:

a first term representing a deviation between a compensated sound field in the bright zone and the target sound field in the bright zone; and a second weighted term representing a difference between power in the dark zone and power in the bright zone based on the sound field models of the bright zone and dark zone, wherein the criterion function further includes a third term representing filter power and penalizing high filter gains.

8. A system configured to determine filter parameters of an audio precompensation filter for the compensation of an associated sound generating system having at least two loudspeakers, wherein the system is configured to obtain sound field models describing the sound field in at least one region of space designated the bright zone and the sound field in at least one region of space designated the dark zone;

wherein the system is configured to obtain a target sound field in the bright zone;

wherein the system is configured to determine filter parameters of the audio precompensation filter so that a criterion function is optimized under the constraint of causality and stability of the dynamics of the audio precompensation filter, wherein the criterion function includes at least:

a first term representing a deviation between a compensated sound field in the bright zone and the target sound field in the bright zone; and a second weighted term representing a difference between power in the dark zone and power in the bright zone based on the sound field models of the bright zone and dark zone, wherein the criterion function includes, as the second weighted term, the expected value of the difference between the power in the dark zone and the power in the bright zone, as generated by the filtered sound generating system:

$$E\{\lambda(\sigma_D^T\sigma_D - \alpha\sigma_B^T\sigma_B)\} \; \lambda>0, \; \alpha>0,$$

where $\lambda$ and $\alpha$ are configurable values, and $\sigma_D = \Phi_D H_D Rr(t)$ in which $\Phi_D$ is a matrix weight for the dark zone, which can be used to emphasize different aspects of the contrast term of the criterion relative to the other terms, the factor $H_D$ represents a model of the system in the dark zone, R is the filter to be optimized and r(t) is the current sample of an input signal, and $\sigma_B = \Phi_B H_B Rr(t)$, wherein $H_B$ holds the system model in the bright zone, and T represents the transpose operator and $\Phi_B$ is a matrix weight for the bright zone.

* * * * *